(12) United States Patent
Yeh et al.

(10) Patent No.: US 7,466,550 B2
(45) Date of Patent: Dec. 16, 2008

(54) INTEGRATED HEAT DISSIPATING ASSEMBLY

(75) Inventors: Yun-Yu Yeh, Zhonghe (TW);
Chia-Ming Tung, Taipei Hsien (TW);
Chien-Kai Lin, Banciao (TW)

(73) Assignee: Xigmatek Co., Ltd (TW)

( * ) Notice: Subject to any disclaimer, the term of this patent is extended or adjusted under 35 U.S.C. 154(b) by 104 days.

(21) Appl. No.: 11/592,187

(22) Filed: Nov. 3, 2006

(65) Prior Publication Data
US 2008/0105407 A1     May 8, 2008

(51) Int. Cl.
*H05K 7/20* (2006.01)
*H01L 23/36* (2006.01)

(52) U.S. Cl. .................. 361/700; 361/699; 361/701; 361/703; 165/80.4; 165/185; 257/714; 62/259.2

(58) Field of Classification Search .............. 361/687, 361/690, 695–704, 717–719; 62/259.2; 165/80.3, 165/80.4, 80.5, 104.25, 104.28, 104.33, 104.34, 165/121–126, 185, 104.31; 257/713–715, 257/718, 719, 722
See application file for complete search history.

(56) References Cited
U.S. PATENT DOCUMENTS

| | | | | |
|---|---|---|---|---|
| 5,121,788 A | * | 6/1992 | Carollo | 165/47 |
| 6,019,165 A | * | 2/2000 | Batchelder | 165/80.3 |
| 6,668,911 B2 | * | 12/2003 | Bingler | 165/80.4 |
| 6,894,899 B2 | * | 5/2005 | Wu et al. | 361/699 |
| 6,945,315 B1 | * | 9/2005 | Gektin et al. | 165/80.4 |
| 7,100,677 B2 | * | 9/2006 | Lee et al. | 165/80.4 |
| 7,114,551 B2 | * | 10/2006 | Matsushita et al. | 165/80.4 |
| 7,273,092 B2 | * | 9/2007 | Huang et al. | 165/149 |
| 2004/0052048 A1 | * | 3/2004 | Wu et al. | 361/699 |
| 2004/0125561 A1 | * | 7/2004 | Gwin et al. | 361/699 |

FOREIGN PATENT DOCUMENTS

WO    WO0165900 A1 *  9/2001

* cited by examiner

*Primary Examiner*—Michael V Datskovskiy
(74) *Attorney, Agent, or Firm*—Hershkovitz & Associates, LLC; Abe Hershkovitz (57) ABSTRACT

An integrated heat dissipating assembly includes two heat sinks, a heat dissipating fan mounted between the two sinks and a body provided below the two heat sinks and the heat dissipating fan. The body is composed of a hollow body, a pump received inside the hollow body and a base attached to a bottom face of the hollow body for conducting heat from a heat source. The hollow body is divided into receiving spaces respectively communicating with water channels of the two heat sinks such that cooling water flowing inside the hollow body and the water channels of the two heat sinks is able to take away heat from the base. The heat is then dissipated by cool air due to the heat dissipating fan.

18 Claims, 9 Drawing Sheets

INTEGRATED HEAT DISSIPATING ASSEMBLY

BACKGROUND OF THE INVENTION

1. Field of the Invention

The present invention relates to an integrated heat dissipating assembly, and more particularly to an integrated heat dissipating assembly having at least one heat sink mounted on top of a hollow body which is configured to receive cooling water therein and a heat dissipating fan provided on a side of the heat sink such that when the cooling water, after absorbs heat from a heat source, is flowing through the heat sink, air agitated by the heat dissipating fan is able to dissipate the heat in the cooling water.

2. Description of the Prior Art

The most common technology used to dissipate heat in electronic appliances is either via air or via water as coolant. When air is used as a heat dissipating medium, a heat dissipating fan and a heat dissipating fin assembly are used, wherein heat from a heat source is conducted to the heat dissipating fin assembly and then the air flow driven by the heat dissipating fan and flowing through the heat dissipating fin assembly is able to take away the heat on the heat dissipating fin assembly. When cooling water is used as a heat dissipating medium, a loop is provided to the cooling water so that after the cooling water absorbs heat from a heat source, the cooling water is able to proceed heat exchange to dissipate the heat. It is also well known in the heat dissipating art that a specific heat dissipating medium (air or cooling water) is particularly useful in some applications so that people do not even bother to think about merging these two heat dissipating media together so as to achieve a multiply effect.

No matter what media is used in the heat dissipating technology, it is well known that once the medium is chosen, the following design of the heat sink is totally based on the chosen medium. Also, the heat dissipating ability is determined. There is almost no link between these two different heat dissipating media. As a result, there is no current technology to combine the features of these two different media. Thus no multiply effect has ever been expected in the heat dissipating field.

To overcome the shortcomings, the present invention tends to provide an improved integrated heat dissipating assembly to mitigate the aforementioned problems.

SUMMARY OF THE INVENTION

The primary objective of the present invention is to provide an integrated heat dissipating assembly having at least one heat sink mounted on top of a hollow body divided into chambers through which cooling water flows and a heat dissipating fan mounted on top of the hollow body and beside the at least one heat sink such that after the cooling water absorbs heat from a heat source and flows through the heat sink, air, agitated by the heat dissipating fan and flowing through the at least one heat sink is able to take away the heat in the cooling water.

Another objective of the present invention is that the hollow body is divided into three chambers and there are two heat sink on top of the hollow body such that cooling water is able to absorb the heat from the heat source while flowing through the chambers.

Still another objective of the present invention is that a base is provided to a bottom face of the hollow body and attached to a heat source. The base has an arcuate groove defined in a face of the base to communicate with an interior via the inlet and the second hole of the hollow body such that the cooling water is able to flow through the arcuate slot to take away the heat from the heat source.

Other objects, advantages and novel features of the invention will become more apparent from the following detailed description when taken in conjunction with the accompanying drawings.

DETAILED DESCRIPTION OF THE PREFERRED EMBODIMENT

With reference to FIGS. 1, 2, 3 and 4 it is noted that the integrated heat dissipating assembly in accordance with the present invention includes at least one heat sink (1) (two heat sinks (11, 12) are shown in this embodiment), a heat dissipating fan (2) and a body (3), wherein the body (3) is composed of a hollow body (31), a pump (32) and a base (33) attachable to a heat source, e.g. a central processing unit (CPU) and having an arcuate groove (331) defined therein.

Figure 2:
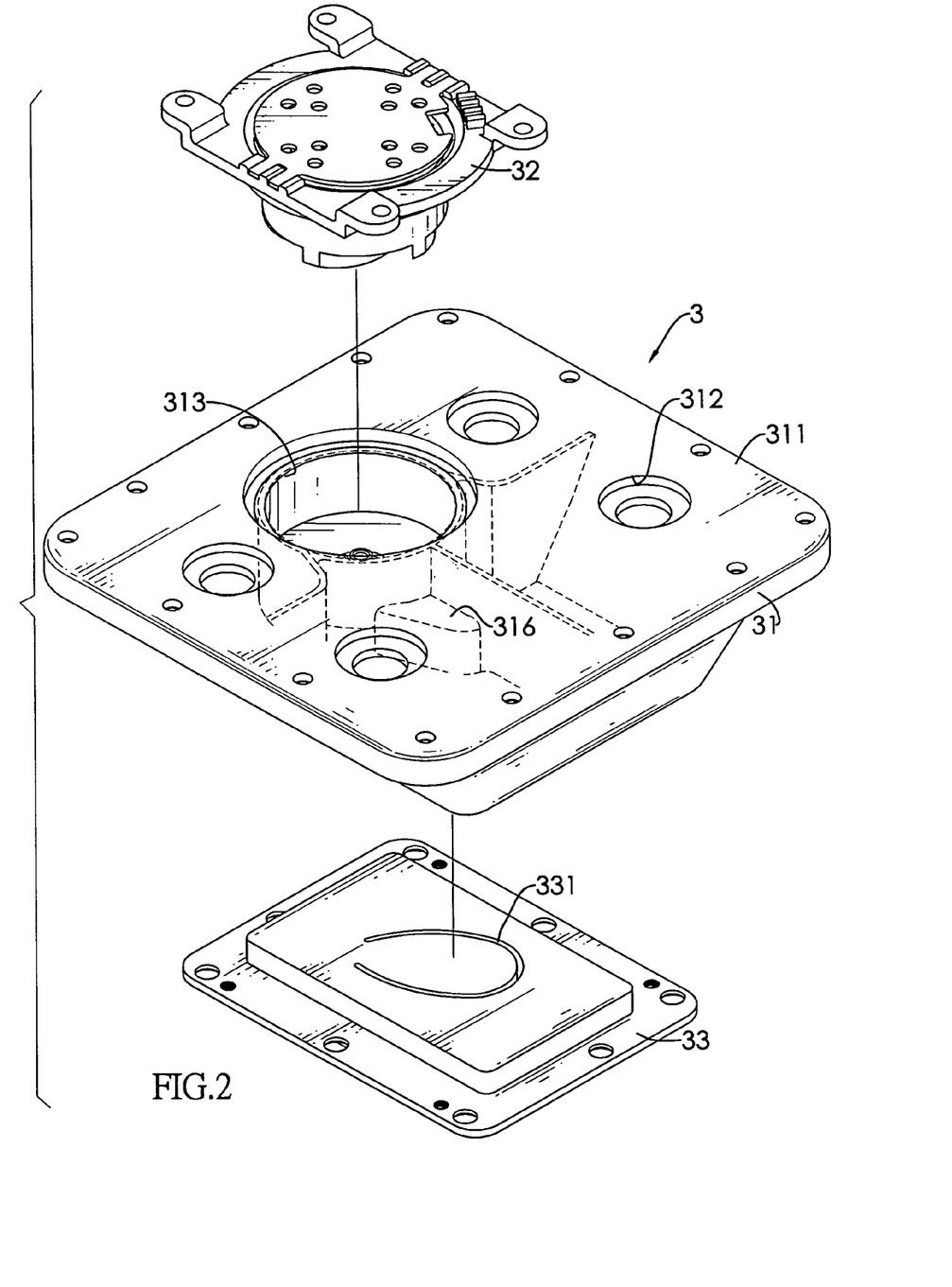
FIG. 2 is an exploded perspective showing the pump, the hollow body and the base.
Figure 3:
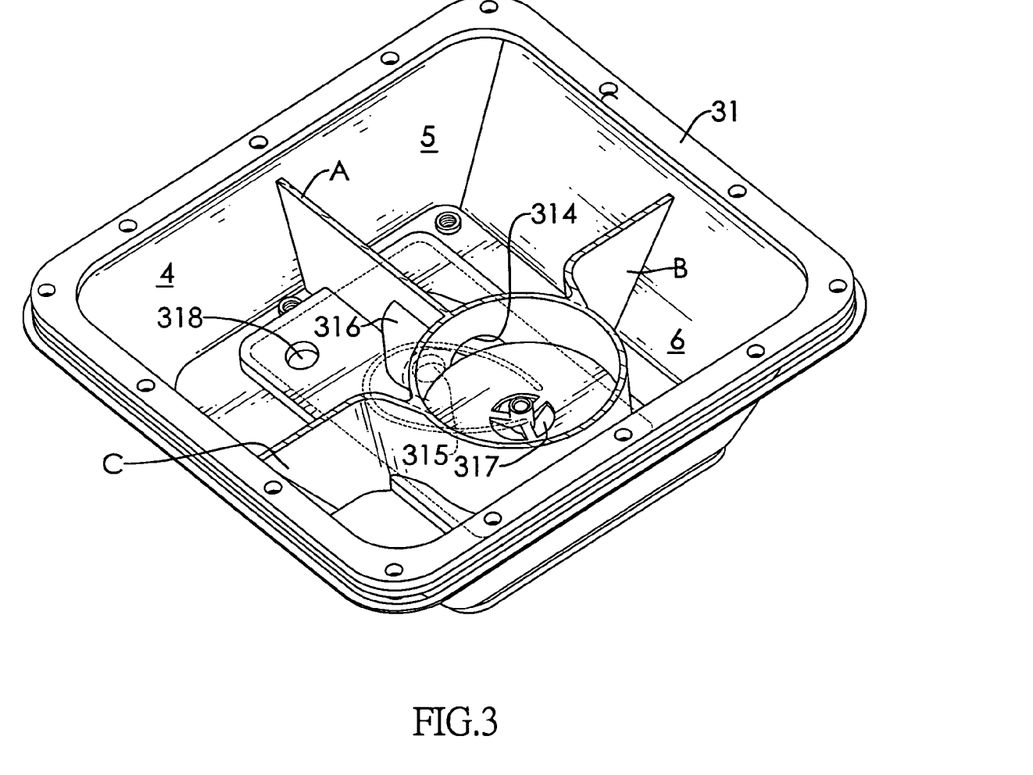
FIG. 3 is a perspective view of the hollow body of the present invention.

The hollow body (31) has a top face (311) provided on top of the hollow body, at least four through holes (312) defined through the top face (311) to communicate with an interior of the hollow body (31), a recess (313) defined in the top face (311) to receive therein a pump (32), an outlet (314) defined in a bottom face defining the recess (313) to communicate with the recess (313), an outflow room (316) formed on an outer face defining the recess (313) to communicate with the outlet (314), an inlet (315) defined in the bottom face of the outflow room (316) to communicate with an interior of the outflow room (316) and the outlet (314), a first hole (317) centrally defined in the bottom face of the recess (313) and a second hole (318) defined in the bottom face of the hollow body (31) to communicate with the inlet (315).

With reference to especially FIG. 3, in order to know the internal structure of the hollow body (31), the top face (311) of the hollow body (31) is removed. It is noted that there are three baffles, a first baffle (A), a second baffle (B) and a third baffle (C), formed inside the interior of the hollow body (31) to divide the interior of the hollow body (31) into a first receiving space (4), a second receiving space (5) isolated from the first receiving space (4) and a third receiving space (6) isolated from both the first receiving space (4) and the second receiving space (5). From this embodiment of the present invention, it is noted that the second hole (318) communicates with the first receiving space (4).

Figure 5:
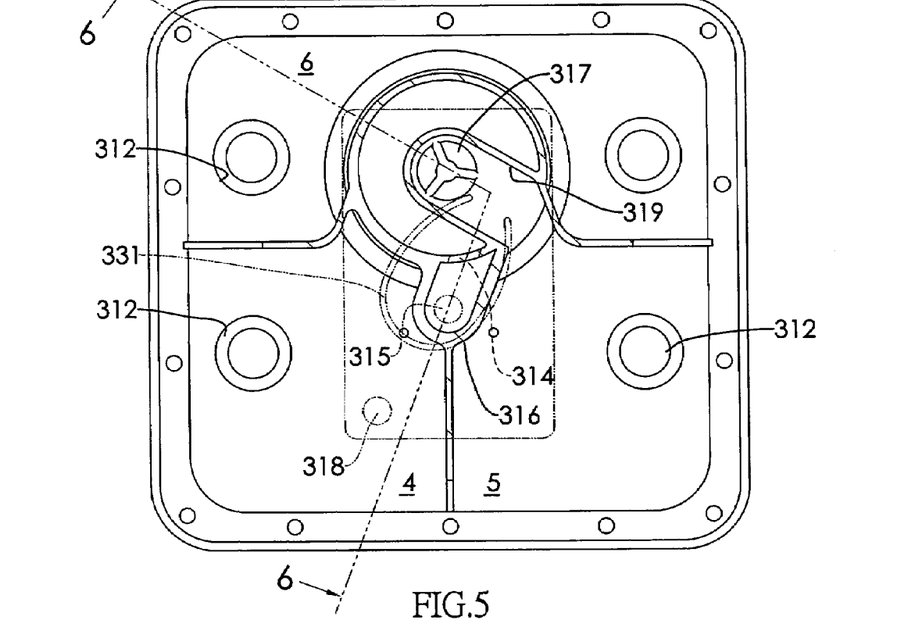
FIG. 5 is a top plan view of the hollow body of the present invention.
Figure 6:
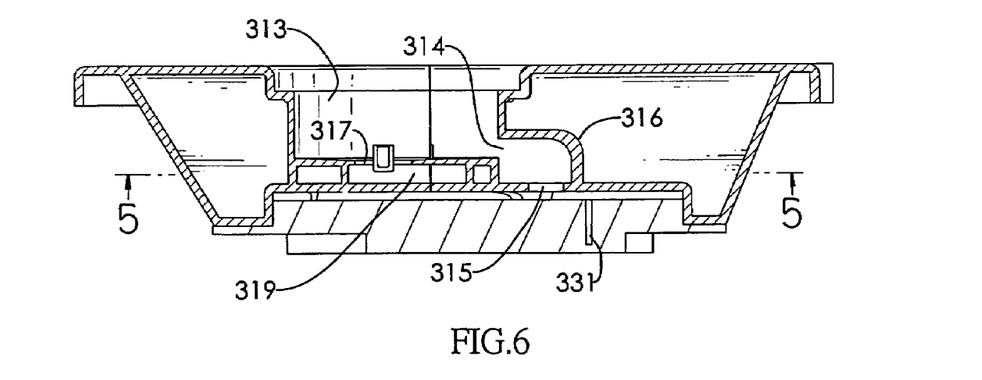
FIG. 6 is a cross sectional view taken from line 6-6 of FIG. 5.

With reference to FIGS. 5 and 6, it is noted that the outlet (314) communicates with the inlet (315) which in turn communicates with the second hole (318) via the arcurate groove (331) of the base (33). The second hole (318) communicates with the first receiving space (4).

Figure 1:
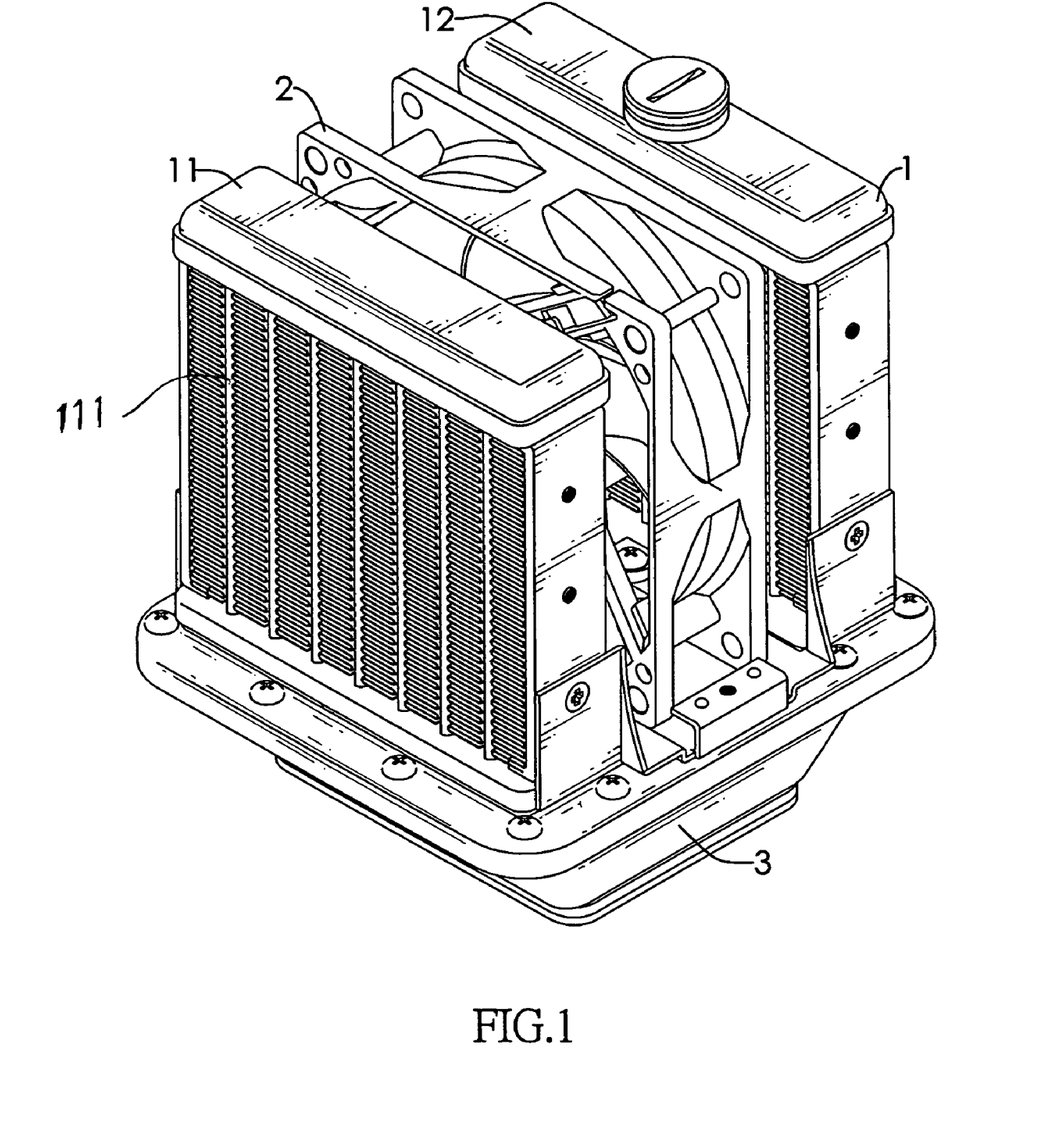
FIG. 1 is a perspective view of the integrated heat dissipating assembly of the present invention.
Figure 4:
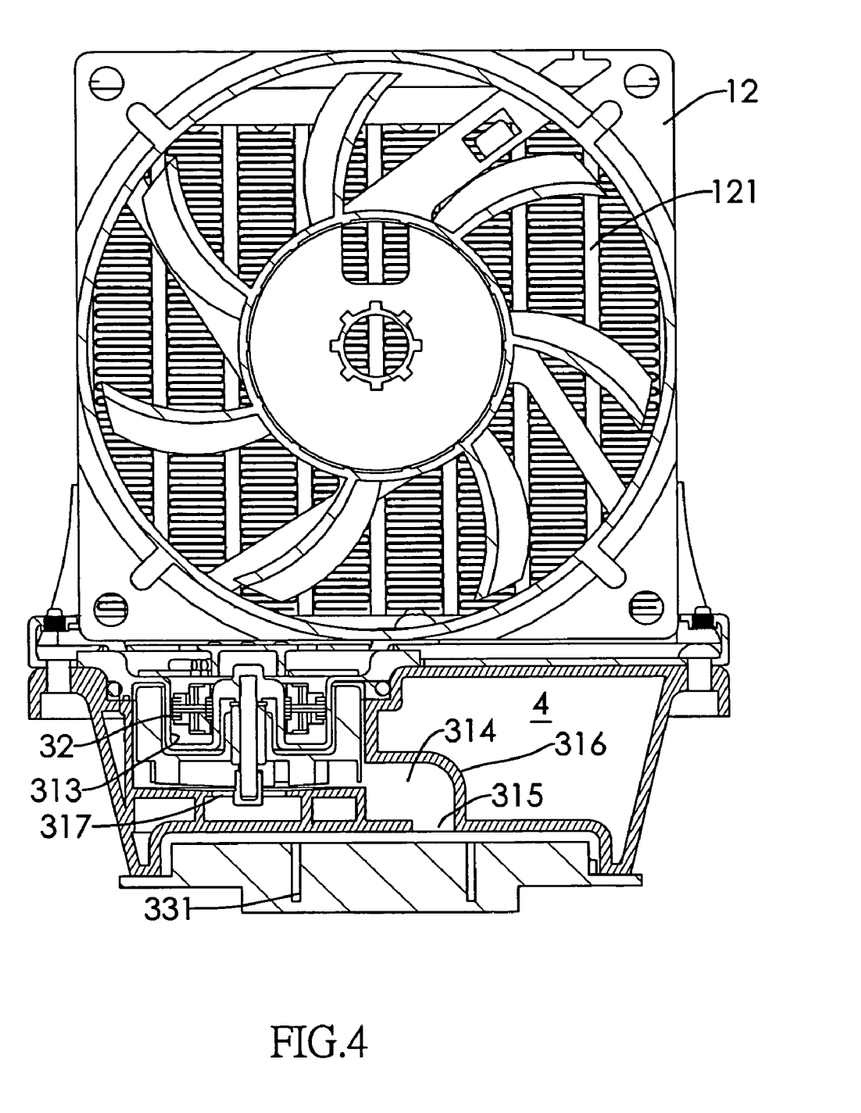
FIG. 4 is a schematic cross sectional view of the integrated heat dissipating assembly of the present invention.
Figure 7:
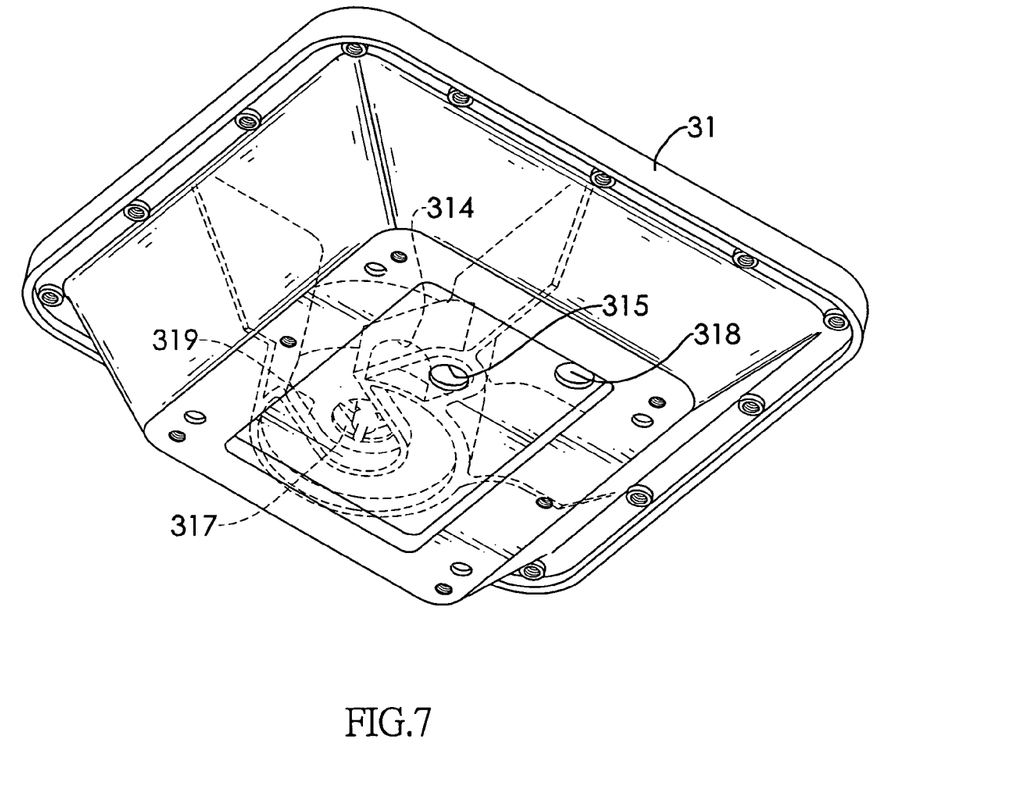
FIG. 7 is a perspective view of the hollow body in an angle different from that of FIG. 3.

With reference to FIGS. 1 and 7 and still taking FIGS. 2, 4 and 5 for reference, it is noted that when the assembly of the present invention is assembled, the pump (32) is received inside the recess (313) and a first heat sink (11) is mounted on top of the top face (311) and on top of the first receiving space (4) and the third receiving space (6) and a second heat sink (12) is also mounted on top of the top face (311) and on top of the second receiving space (5) and the third receiving space (6). Both the first heat sink (11) and the second heat sink (12) are respectively provided with water channels (111, 121). The heat dissipating fan (2) is mounted on top of the top face (311) and between the first heat sink (11) and the second heat sink (12).

Due to the provision of the water channels (111) of the first heat sink (11) which is on top of the first receiving space (4) and the third receiving space (6), it is noted that the water channels (111) of the first heat sink (11) communicate with the first receiving space (4) and the third receiving space (6) via the two through holes (312) on the top face (311). The water channels (121) of the second heat sink (12) communicate with the second receiving space (5) and the third receiving space (6) via the other two through holes (312) on the top face (311).

Thus the pump (32) is able to agitate the cooling water received inside the hollow body (31). After the cooling water is agitated, the cooling water is forced to flow out of the recess (313) via the outlet (314) and into the outflow room (316). Because the outflow room (316) communicates with the inlet (315) which in turn communicates with the second hole (318) via the arcuate groove (331), the cooling water inside the outflow room (316) flows to and out of the second hole (318). Then the cooling water flows into the water channels (111) of the first heat sink (11). While the cooling water is flowing downward inside the first heat sink (11), cool air flows through the cooling water and takes away the heat which the cooling water absorbs while passing through the arcuate groove (331). After the cooling water takes away the heat from the heat source, the CPU), and then the heat is dissipated by the cool air from the heat dissipating fan (2), the cooling water continues to flow another portion of the third receiving space (6), which communicates with the second receiving space (5). The cooling water flowing inside the third receiving space (6) is forced by the current to flow upward into the water channels (121) of the second heat sink (12) via one of the two through holes (312). Inside the second heat sink (12), the cooling water then flows downward and enters an entrance (319) defined in a bottom face of a chamber formed on the bottom face of the recess (313) to enter the recess (313) via the first hole (317). Thereafter, a cycle of the cooling water to dissipate heat is completed.

Because the cooling water must flow through the arcuate groove (331) to flow to the second hole (318), the heat from the heat source is then taken away by the cooling water to the first heat sink (11) to be dissipated by the cool air flowing through either the first heat sink (11) or the second heat sink (12) depending on which direction the heat dissipating fan is facing.

Figure 8:
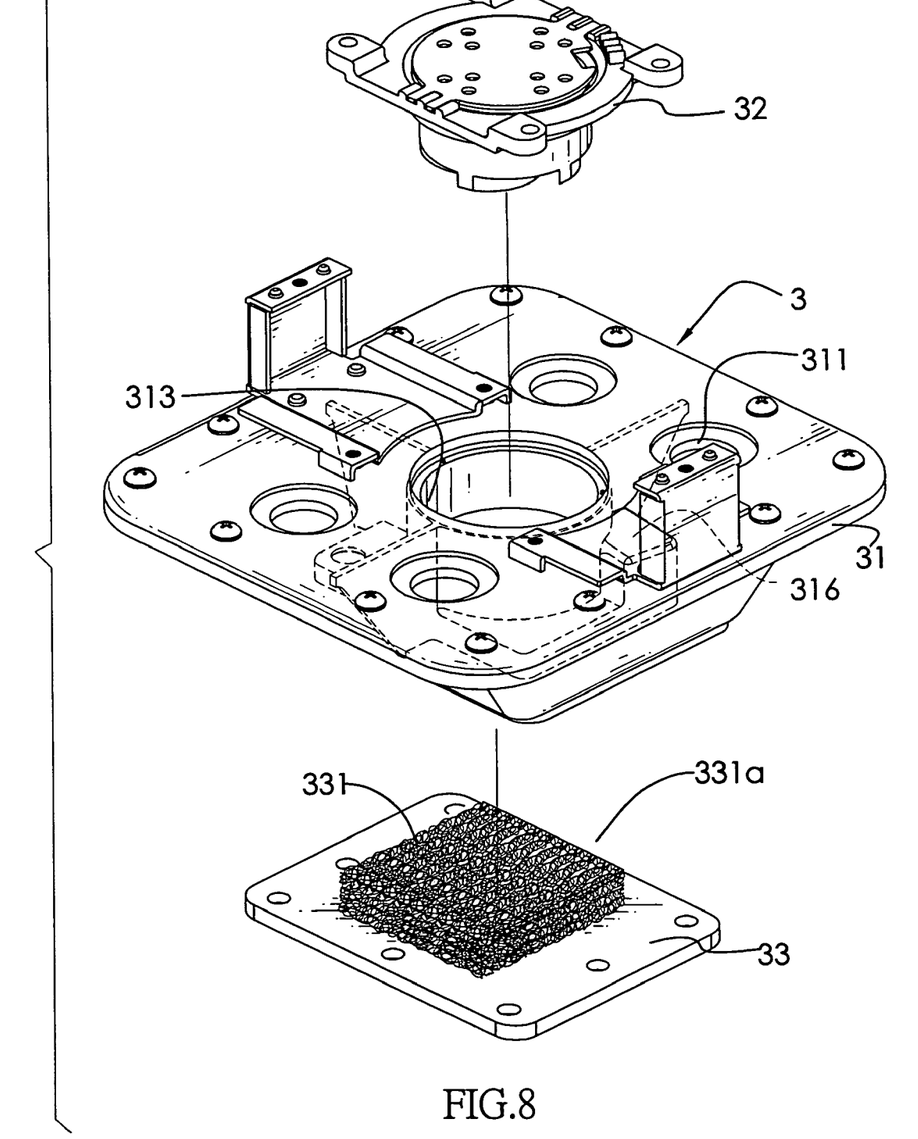
FIG. 8 is an exploded perspective view showing a different embodiment of the present invention.

With reference to FIG. 8, it is noted that there are arcuate grooves (331) defined inside a heat dissipating block (331a) which is formed on top of the base (33) and made of brass such that the cooling water is able to flow through the arcuate grooves (331) to take away the heat.

Figure 9:
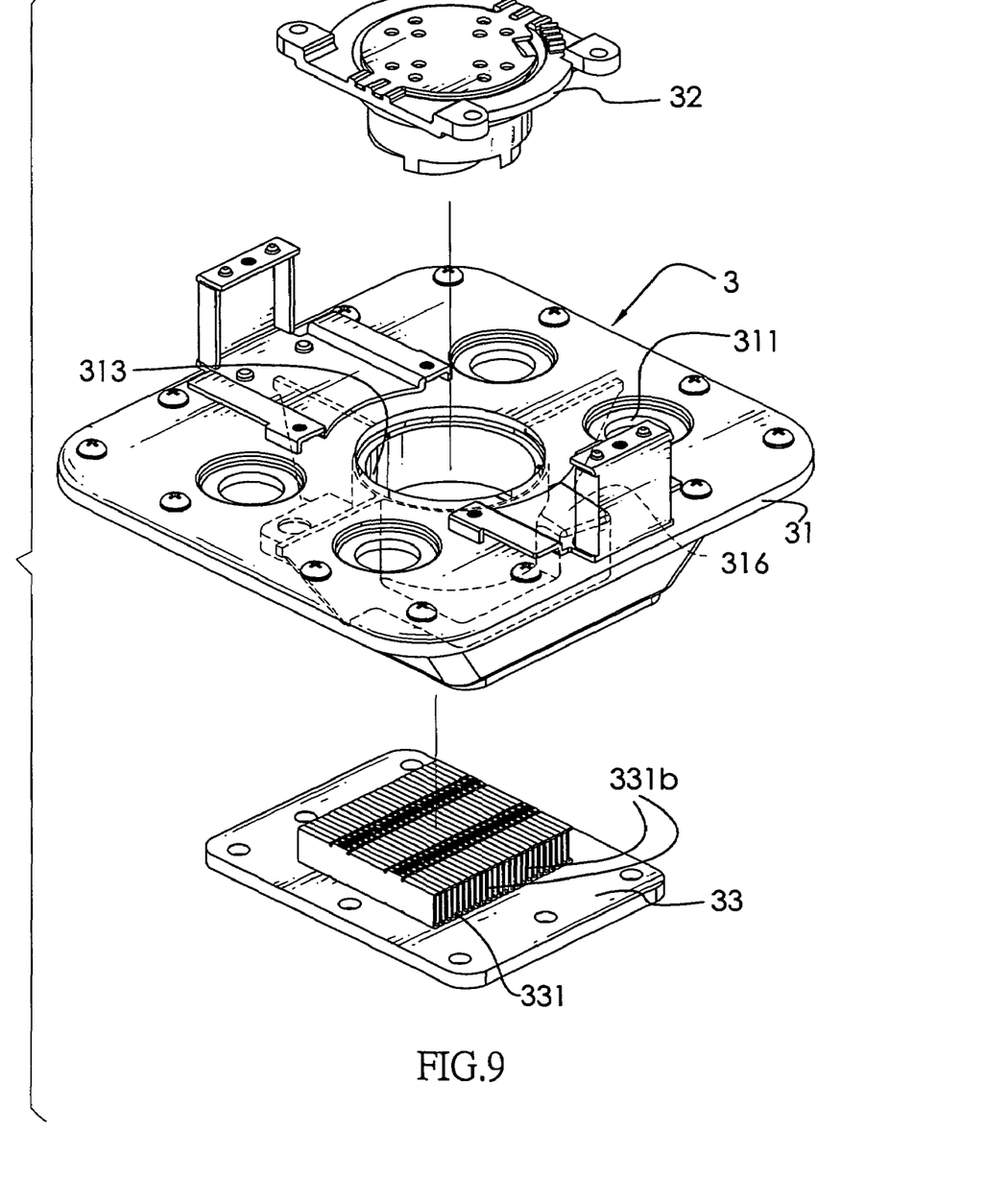
FIG. 9 is an exploded perspective view of still a different embodiment of the present invention.
Figure 10:
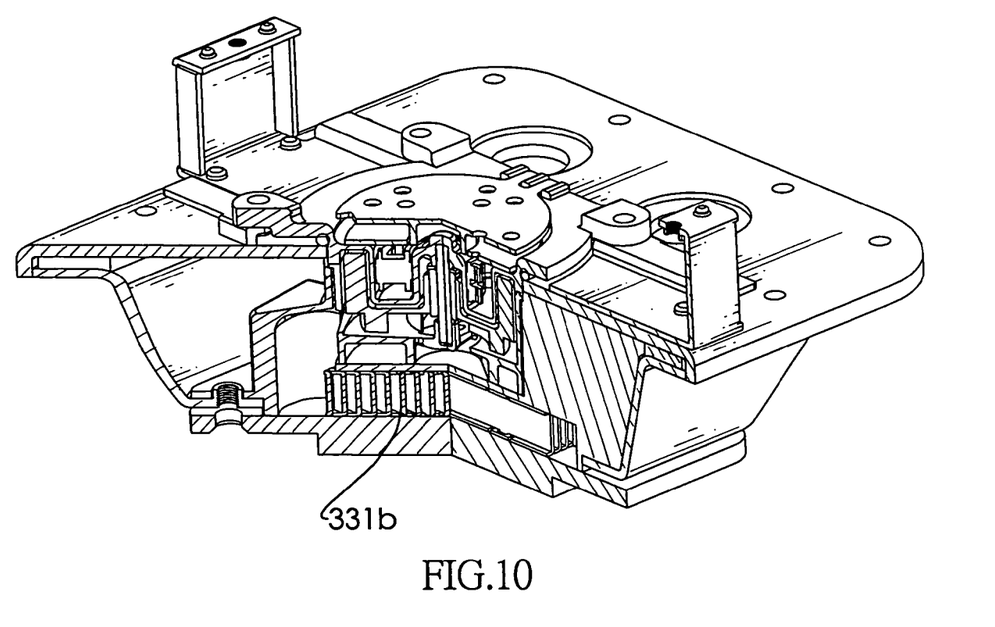
FIG. 10 is a partially cross sectional view of the embodiment of FIG. 9 after the pump, the hollow body and the base are assembled.

With reference to FIGS. 9 and 10, it is noted that there are multiple arcuate grooves (331) defined in a fin assembly (331b) formed on top of the base (33) such that the cooling water is able to flow through the arcuate grooves (331) to take away the heat.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An integrated heat dissipating assembly comprising at least one heat sink, a heat dissipating fan and a body, wherein
    the body is composed of a hollow body, a pump and a base,
        the hollow body has multiple receiving spaces defined in an interior of the hollow body for receiving therein cooling water,
    the pump is received inside the hollow body,
    the base is securely attached to a bottom face of the hollow body for engagement with a heat source so as to allow the heat to be conducted to the base,
    the at least one heat sink is mounted on top of the hollow body and has multiple water channels to respectively communicate partially with the receiving spaces, and
    the heat dissipating fan is mounted on top of the hollow body and close to the at least one heat sink to provide cool air for dissipating the heat from the heat source, such that cooling water flowing through the receiving spaces and passing through the base is able to absorb the heat from the heat source and the cool air agitated by the heat dissipating fan is able to dissipate the heat while the cooling water flows through the at least one heat sink, wherein
    a first receiving space, a second receiving space isolated from the first receiving space and a third receiving space isolated from the first receiving space and the second receiving space are defined inside the interior of the hollow body, the hollow body has a top face with four through holes defined through the top face to allow two of the four through holes to respectively communicate with the first receiving space and the third receiving space and to allow the other two through holes to respectively communicate with the second receiving space and the third receiving space.

2. The integrated heat dissipating assembly as claimed in claim 1, wherein the base has an arcuate groove defined in a top face of the base engaging with the bottom face of the hollow body.

3. The integrated heat dissipating assembly as claimed in claim 1, wherein the hollow body has a recess defined in a top face of the top face receiving therein the pump, an outlet defined in a bottom face defining the recess to communicate with the recess, an outflow room formed on an outer side face of the recess and communicating with the outlet, and an inlet defined in a bottom face of the outflow room to communicate with an interior of the outflow room and the recess.

4. The integrated heat dissipating assembly as claimed in claim 2, wherein the hollow body has a recess defined in a top face of the top face receiving therein the pump, an outlet defined in a bottom face defining the recess to communicate with the recess, an outflow room formed on an outer side face of the recess and communicating with the outlet, and an inlet defined in a bottom face of the outflow room to communicate with the arcuate groove, an interior of the outflow room and the recess.

5. The integrated heat dissipating assembly as claimed in claim 1, wherein the hollow body has a recess and a first hole defined in a bottom face defining the recess to communicate with the recess.

6. The integrated heat dissipating assembly as claimed in claim 3, wherein a first hole is defined in a bottom face defining the recess to communicate with the recess and a second hole is defined in the bottom face of the hollow body to communicate with the inlet as well as an interior of the first receiving space.

7. The integrated heat dissipating assembly as claimed in claim 3, wherein a first heat sink having therein multiple first water channels is mounted on the top face of the hollow body and on top of the first receiving space and the third receiving space, a second heat sink having therein multiple second water channels is mounted on top of the hollow body and on top of the second receiving space and the third receiving space such that the first water channels communicate with the first receiving space and the third receiving space and the second water channels communicate with the second receiving space and the third receiving space.

8. The integrated heat dissipating assembly as claimed in claim 7, wherein a first heat sink having therein multiple first water channels is mounted on the top face of the hollow body and on top of the first receiving space and the third receiving space, a second heat sink having therein multiple second water channels is mounted on top of the hollow body and on top second receiving space and the third receiving space such that the first water channels communicate with the first receiving space and the third receiving space and the second water channels communicate with the second receiving space and the third receiving space.

9. The integrated heat dissipating assembly as claimed in claim 6, wherein an entrance is defined in a bottom face of a chamber formed on the bottom face of the recess to enter the recess via the first hole.

10. The integrated heat dissipating assembly as claimed in claim 7, wherein an entrance is defined in a bottom face of a chamber formed on the bottom face of the recess to enter the recess via the first hole.

11. The integrated heat dissipating assembly as claimed in claim 8, wherein an entrance is defined in a bottom face of a chamber formed on the bottom face of the recess to enter the recess via the first hole.

12. The integrated heat dissipating assembly as claimed in claim 3, wherein the arcuate groove is defined in a heat dissipating block which is made of brass.

13. The integrated heat dissipating assembly as claimed in claim 6, wherein the arcuate groove is defined in a heat dissipating block which is made of brass.

14. The integrated heat dissipating assembly as claimed in claim 10, wherein the arcuate groove is defined in a heat dissipating block which is made of brass.

15. The integrated heat dissipating assembly as claimed in claim 11, wherein the arcuate groove is defined in a heat dissipating block which is made of brass.

16. The integrated heat dissipating assembly as claimed in claim 3, wherein the arcuate groove is defined in a fin assembly formed on top of the base.

17. The integrated heat dissipating assembly as claimed in claim 6, wherein the arcuate groove is defined in a fin assembly formed on top of the base.

18. The integrated heat dissipating assembly as claimed in claim 11, wherein the arcuate groove is defined in a fin assembly formed on top of the base.

* * * * *